United States Patent [19]
Erger et al.

[11] Patent Number: 5,839,092
[45] Date of Patent: Nov. 17, 1998

[54] ARCING FAULT DETECTION SYSTEM USING FLUCTUATIONS IN CURRENT PEAKS AND WAVEFORMS

[75] Inventors: Robert J. Erger; Kon B. Wong; Charles D. Bettis, all of Cedar Rapids, Iowa

[73] Assignee: Square D Company, Palatine, Ill.

[21] Appl. No.: 825,005

[22] Filed: Mar. 26, 1997

[51] Int. Cl.$^6$ .................................................. G01R 31/08
[52] U.S. Cl. .............................. 702/58; 361/42; 324/536
[58] Field of Search .............................. 364/487; 361/42, 361/93; 324/536; 702/58

[56] References Cited

U.S. PATENT DOCUMENTS

| H536 | 10/1988 | Strickland et al. | 324/456 |
|---|---|---|---|
| H538 | 11/1988 | Betzold | 89/134 |
| 30,678 | 7/1860 | Van Zeeland et al. | 361/44 |

(List continued on next page.)

FOREIGN PATENT DOCUMENTS

| 0 094 871 A1 | 5/1983 | European Pat. Off. . | |
| 0 615 327 | 9/1994 | European Pat. Off. | H02H 1/00 |
| 0 649 207 A1 | 4/1995 | European Pat. Off. . | |
| 0 748 021 A1 | 12/1996 | European Pat. Off. . | |
| 0 762 591 A2 | 3/1997 | European Pat. Off. . | |
| 0 802 602 A2 | 10/1997 | European Pat. Off. . | |
| 0813281 | 12/1997 | European Pat. Off. . | |
| 2 177 561 | 6/1985 | United Kingdom . | |
| 2285886 | 7/1995 | United Kingdom . | |
| WO 97/30501 | 8/1997 | WIPO . | |

OTHER PUBLICATIONS

Antonio N. Paolantonio, P.E., Directional Couplers, R.F. Design, Sep./Oct., 1979, pp. 40–49.

Alejandro Duenas, J., Directional Coupler Design Graphs For Parallel Coupled Lines and Interdigitated 3 dB Couplers, RF Design, Feb., 1986, pp. 62–64.

RV4145 Low Power Ground Fault Interrupter, Preliminary Product Specifications of Integrated Circuits, Raytheon Company Semiconductor Division, 350 Ellis Street, Mountain View CA 94309–7016, pp. 1–8.

Jean–Francois Joubert, Feasibility of Main Service Ground–Fault Protection On The Electrical Service To Dwelling Units, Consultants Electro–ProtectionIns., 1980, Michelin St., Laval, Quebec H7L 9Z7. Oct. 26, 1990, pp. 1–77.

R.D. Russell, Detection Of Arcing Faults On Distribution Feeders, Texas A & M Research Foundation, Box H. College Station, Texas 77843, Final Report Dec., 1982, pp. 1–B18.

*Primary Examiner*—James P. Trammell
*Assistant Examiner*—Matthew Smithers
*Attorney, Agent, or Firm*—Larry I. Golden; Kareem M. Irfan

[57] ABSTRACT

A system for detecting arcing faults in a line conductor carrying an electrical current between a power source and a load, the electrical current defining an AC waveform comprising a series of alternating positive half cycles and negative half cycles. In one embodiment, the method comprises the steps of obtaining current samples in a series of half cycles of the waveform, determining the peak current of each of the half cycles, and comparing the peak currents to determine changes in slope between half cycles. The number of changes in slope occurring within a selected time interval are counted and an arc indicative signal is produced when the number of reversals in polarity in slope occurring within the selected time interval equals or exceeds a predetermined threshold number. In another embodiment, the method comprises, in addition to the steps above, the steps of normalizing each of the current samples and autocorrelating the normalized current samples to obtain a measure of significant waveform shape changes between consecutive half cycles. Both the number of changes in slope and the number of significant waveform shape changes occurring within a selected time interval are counted and an arc indicative signal is produced when the number of reversals in polarity or the number of waveform changes equal or exceed predetermined threshold values.

32 Claims, 9 Drawing Sheets

U.S. PATENT DOCUMENTS

| | | | |
|---|---|---|---|
| 2,808,566 | 10/1957 | Douma | 324/127 |
| 2,832,642 | 4/1958 | Lennox | 299/132 |
| 2,898,420 | 8/1959 | Kuze | 200/87 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |
| 3,600,502 | 8/1971 | Wagenaar et al. | 174/143 |
| 3,622,872 | 11/1971 | Boaz et al. | 324/52 |
| 3,684,955 | 8/1972 | Adams | 324/72 |
| 3,746,930 | 7/1973 | Van Best et al. | 317/31 |
| 3,775,675 | 11/1973 | Freeze et al. | 324/51 |
| 3,812,337 | 5/1974 | Crosley | 235/153 AC |
| 3,858,130 | 12/1974 | Misencik | 335/18 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,914,667 | 10/1975 | Waldron | 317/36 |
| 3,932,790 | 1/1976 | Muchnick | 317/18 D |
| 3,939,410 | 2/1976 | Bitsch et al. | 324/72 |
| 4,052,751 | 10/1977 | Shepard | 361/50 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,354,154 | 10/1982 | Olsen | 324/51 |
| 4,356,443 | 10/1982 | Emery | 324/51 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,639,817 | 1/1987 | Cooper et al. | 361/62 |
| 4,642,733 | 2/1987 | Schacht . | |
| 4,644,439 | 2/1987 | Taarning | 361/87 |
| 4,652,867 | 3/1987 | Masot | 340/638 |
| 4,658,322 | 4/1987 | Rivera | 361/37 |
| 4,697,218 | 9/1987 | Nicolas | 633/882 |
| 4,707,759 | 11/1987 | Bodkin | 831/642 |
| 4,771,355 | 9/1988 | Emery et al. | 361/33 |
| 4,810,954 | 3/1989 | Fam | 324/142 |
| 4,833,564 | 5/1989 | Pardue et al. | 361/93 |
| 4,835,648 | 5/1989 | Yamauchi | 361/14 |
| 4,845,580 | 7/1989 | Kitchens | 361/91 |
| 4,853,818 | 8/1989 | Emery et al. | 361/33 |
| 4,858,054 | 8/1989 | Franklin | 361/57 |
| 4,866,560 | 9/1989 | Allina | 361/104 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,010,438 | 4/1991 | Brady | 361/56 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,166,861 | 11/1992 | Krom | 361/379 |
| 5,168,261 | 12/1992 | Weeks . | |
| 5,179,491 | 1/1993 | Runyan | 361/45 |
| 5,185,684 | 2/1993 | Beihoff et al. | 361/45 |
| 5,185,685 | 2/1993 | Tennie et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham . | |
| 5,307,230 | 4/1994 | MacKenzie | 361/96 |
| 5,334,939 | 8/1994 | Yarbrough . | |
| 5,353,014 | 10/1994 | Carroll et al. | 340/638 |
| 5,359,293 | 10/1994 | Boksiner et al. | 324/544 |
| 5,363,269 | 11/1994 | McDonald . | |
| 5,383,084 | 1/1995 | Gershen et al. | 361/113 |
| 5,388,021 | 2/1995 | Stahl | 361/56 |
| 5,396,179 | 3/1995 | Domenichini et al. | 324/546 |
| 5,412,526 | 5/1995 | Kapp et al. | 361/56 |
| 5,414,590 | 5/1995 | Tajali | 361/669 |
| 5,420,740 | 5/1995 | MacKenzie et al. | 361/45 |
| 5,424,894 | 6/1995 | Briscall et al. | 361/45 |
| 5,434,509 | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,452,223 | 9/1995 | Zuercher et al. | 364/483 |
| 5,459,630 | 10/1995 | MacKenzie et al. | 361/45 |
| 5,477,150 | 12/1995 | Ham, Jr. et al. | 324/536 |
| 5,481,235 | 1/1996 | Heise et al. | 335/18 |
| 5,483,211 | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,506,789 | 4/1996 | Russell et al. | 364/492 |
| 5,510,946 | 4/1996 | Franklin . | |
| 5,512,832 | 4/1996 | Russell et al. | 324/522 |
| 5,519,561 | 5/1996 | Mrenna et al. | 361/105 |
| 5,531,617 | 7/1996 | Marks | 439/723 |
| 5,546,266 | 8/1996 | Mackenzie et al. | 361/93 |
| 5,561,605 | 10/1996 | Zuercher et al. | 364/483 |
| 5,568,371 | 10/1996 | Pitel et al. | 363/39 |
| 5,578,931 | 11/1996 | Russell et al. | 324/536 |
| 5,590,012 | 12/1996 | Dollar | 361/113 |
| 5,602,709 | 2/1997 | Al-Dabbagh | 361/85 |
| 5,608,328 | 3/1997 | Sanderson | 324/529 |
| 5,657,244 | 8/1997 | Seitz | 364/492 |
| 5,659,453 | 8/1997 | Russell et al. . | |
| 5,682,101 | 10/1997 | Brooks et al | 324/536 |
| 5,691,869 | 11/1997 | Engel et al. . | |
| 5,701,110 | 12/1997 | Scheel et al. | 335/132 |
| 5,706,154 | 1/1998 | Seymour | 361/42 |
| 5,729,145 | 3/1998 | Blades | 324/536 |

…

ARCING FAULT DETECTION SYSTEM USING FLUCTUATIONS IN CURRENT PEAKS AND WAVEFORMS

FIELD OF THE INVENTION

The present invention relates generally to the protection of electrical distribution systems from arcing faults and, more particularly, to a system for detecting arcing faults by analyzing low frequency (subharmonic) fluctuations in current peaks and waveforms.

BACKGROUND OF THE INVENTION

Electrical distribution systems in residential, commercial and industrial applications usually include a panelboard or load center for receiving electrical power from a utility source. Electrical power is delivered from the panelboard to designated branch circuits each comprising line and neutral conductors supplying one or more loads. Typically, circuit breakers or other types of protective devices are connected to the branch circuits to reduce the risk of injury, damage or fires. The protective devices may be mounted within the panelboard or connected externally to the panelboard.

Circuit breakers are designed to trip open and interrupt an electric circuit in response to detecting overloads and short circuits in an associated branch circuit of the electrical distribution system. Overload protection is provided by a thermal element which, when heated by the increased current, will cause the circuit breaker to trip and interrupt the power to an associated branch circuit. This can occur when too many loads draw power from the same branch circuit at the same time, or when a single load draws more power than the branch circuit is designed to carry. Short circuit protection is provided by an electromagnetic element that trips when sensing high current flow. Additionally, many circuit breakers provide protection against "ground faults", which occur when current flows from the line conductor to ground through a person or object. This is accomplished by interrupting power to the branch circuit when an imbalance of currents is sensed between the line and neutral conductors.

Arcing fault detectors are another type of protective device which may be used within an electrical distribution system. Arcing fault detectors are designed to trip open and interrupt an electric circuit in response to arcing faults, which occur when electric current "arcs" or flows through ionized gas between two ends of a broken conductor, between two conductors supplying a load, or between a conductor and ground. Arcing faults typically result from corroded, worn or aged wiring or insulation, loose connections, wiring damaged by nails or staples through the insulation, and electrical stress caused by repeated overloading, lightning strikes, etc. The presence of an arcing fault creates a significant fire hazard because it generates heat which may ignite the conductor insulation and adjacent combustible materials. Standard circuit breakers typically can not detect arcing faults because branch or load impedance may cause the level of load current to be reduced below the trip curve settings associated with the thermal or electromagnetic elements of a standard circuit breaker.

There are a variety of systems and devices known in the art for detecting arcing faults. These systems may be classified as either high frequency detection methods or low frequency detection methods. In general, the high frequency detection methods sense for characteristics of arcing faults occurring within each cycle of ac current (or voltage) in the line conductor of a given branch circuit, while the low frequency (or subharmonic) detection methods search for characteristics of arcing faults which may be observed by comparing one cycle of current (or voltage) to another cycle.

A problem associated with the high frequency detection methods is that they may not detect arcing faults which are in series with inductive loads including, for example, motors, transformers or resistive loads containing ferromagnetic heating elements. This is because inductive loads significantly attenuate the high frequency arc signatures within each cycle to the point that arcs can not be distinguished from typical load noise. In systems with inductive loads, therefore, low frequency or subharmonic arc detection methods provide a more reliable indication of arcing faults because low frequency or subharmonic arc signatures are not significantly attenuated by inductive loads. A problem associated with known subharmonic arc detection methods, however, is that they may "false trip" or erroneously indicate an arcing fault in response to load transients caused by, for example,
the starting of an electrical motor. This is because load transients cause changes in magnitude of the current between cycles, and most subharmonic arc detection systems indicate or at least conditionally indicate the presence of an arcing fault in response to changes in magnitude of current.

In order to prevent or reduce the effects of the problems described above, there is a need for a fault detection system which can reliably detect arcing faults in series with inductive loads, and which does not false trip in response to load transients. The present invention is directed to satisfying or at least partially satisfying the aforementioned needs.

SUMMARY OF THE INVENTION

In accordance with one aspect of the present invention, there is provided a method and apparatus for detecting arcing faults in a line conductor carrying an electrical current between a power source and a load, the electrical current defining an AC waveform comprising a series of alternating positive half cycles and negative half cycles. The method comprises the steps of obtaining current samples in a series of half cycles of the waveform, determining the peak current of each of the half cycles, and comparing the peak currents to determine changes in slope between half cycles. The number of changes in slope occurring within a selected time interval are counted and an arc indicative signal is produced when the number of reversals in polarity of the slope occurring within the selected time interval equals or exceeds a predetermined threshold number.

In accordance another aspect of the present invention, there is provided an alternative method and apparatus for detecting arcing faults in a line conductor carrying an electrical current between a power source and a load, the electrical current defining an AC waveform comprising a series of alternating positive half cycles and negative half cycles. The method comprises the steps of obtaining current samples in a series of half cycles, determining the peak current in each of the half cycles, and comparing the peak currents to determine slope changes between consecutive half cycles as described above. The method further comprises the steps of normalizing each of the current samples and autocorrelating the normalized current samples to obtain a measure of significant waveform shape changes between consecutive half cycles. Both the number of changes in slope and the number of significant waveform shape changes occurring within a selected time interval are counted and an arc indicative signal is produced when the number of reversals in polarity or the number of waveform changes equal or exceed predetermined threshold values.

BRIEF DESCRIPTION OF THE DRAWINGS

In the drawings, which comprise a portion of this disclosure.

DETAILED DESCRIPTION

Figure 1:
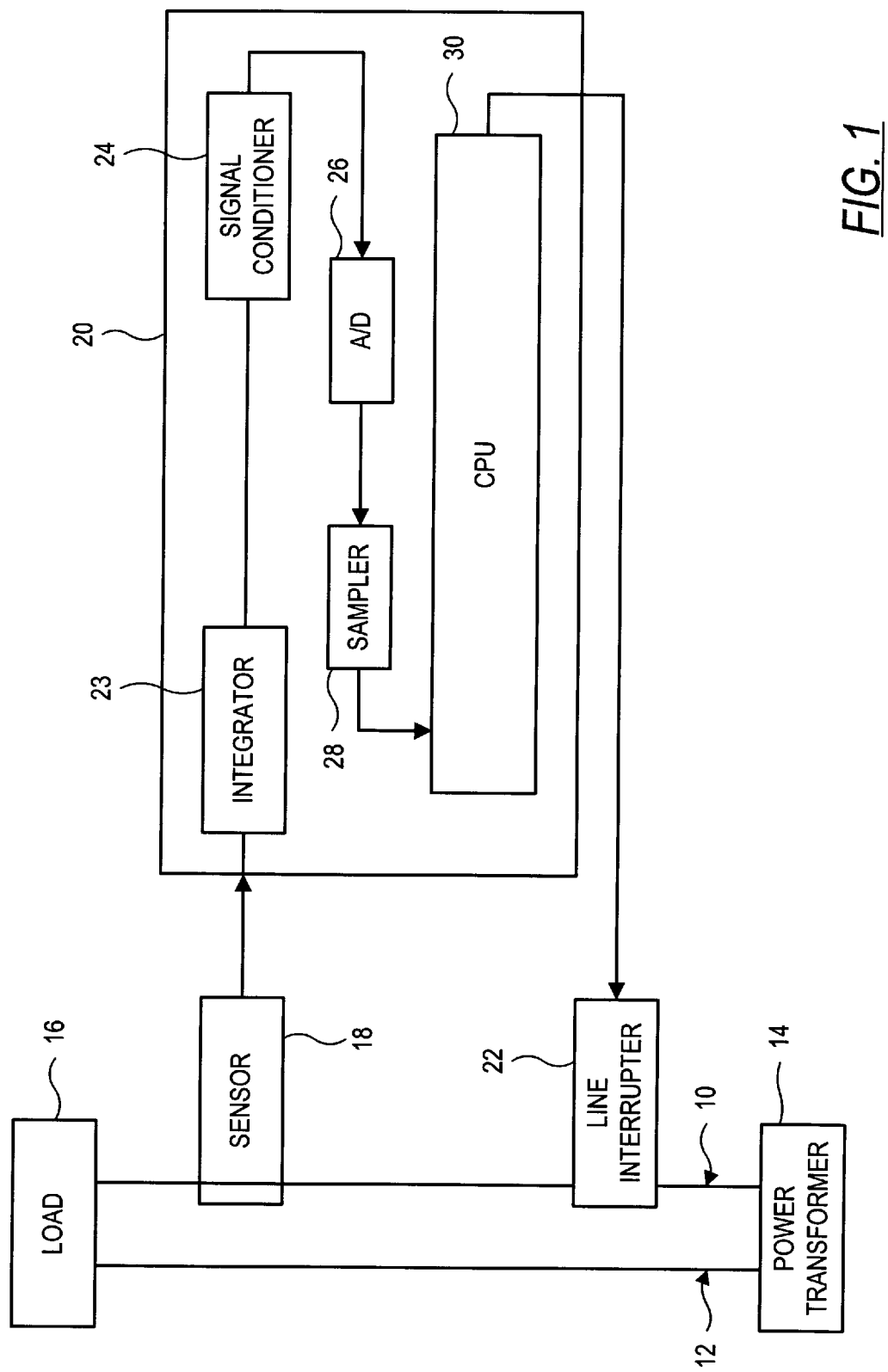
FIG. 1 is a schematic block diagram of an electrical distribution circuit including an arcing fault detection system according to principles of the present invention.

Turning now to the drawings and referring initially to FIG. 1, there is shown a schematic block diagram of an arcing fault detection system connected to a single branch circuit of an electrical distribution system. It will be appreciated, however, that the arcing fault detection system may be connected to multiple branch circuits. Each branch circuit is comprised of line conductor 10 and neutral conductor 12 which distribute electrical power from a utility company power transformer 14 to a load 16. The line conductor 10 and neutral conductor 12 are typically at 240 volts or 120 volts, and a frequency of 60 Hz. A sensor 18 senses the rate of change of electrical current on the line conductor 10 and sends a rate-of-change signal, commonly referred to as a di/dt signal, to an arc detector 20. As will be described in detail hereinafter, the arc detector 20 processes and evaluates the sensor signal for characteristics of arcing faults. If the arc detector 20 senses the occurrence of an arcing fault, it produces a trip signal to line interrupter 22, which interrupts the current in line conductor 10.

The line interrupter 22 is preferably a circuit breaker which includes an overload trip mechanism having a thermal/magnetic characteristic which trips the breaker contacts to an open circuit condition in response to a given overload condition, to disconnect the load 16 from the power source, as is known in the art. It is also known to provide the circuit breaker 22 with ground fault interrupter circuitry responding to a line or neutral-to-ground fault to energize a trip solenoid which trips the circuit breaker and opens the contacts.

The sensor 18 preferably comprises a toroidal sensor having an annular core encompassing the current-carrying line conductor 10, with the sensing coil wound helically on the core. The core is made of magnetic material such as a ferrite, iron, or molded permeable powder capable of responding to rapid changes in flux. A preferred sensor uses a ferrite core wound with 200 turns of 24–36 gauge copper wire to form the sensing coil. An air gap may be cut into the core to reduce the permeability to about 30. The core material preferably does not saturate during the relatively high currents produced by parallel arcs, so that arc detection is still possible at those high current levels.

Other means for sensing the rate of change of the current in a line conductor are contemplated by the present invention. By Faraday's Law, any coil produces a voltage proportional to the rate of change in magnetic flux passing through the coil. The current associated with an arcing fault generates a magnetic flux around the conductor, and the coil of the sensor 18 intersects this flux to produce a signal. Other suitable sensors include a toroidal transformer with a core of magnetic material or an air core, an inductor or a transformer with a laminated core of magnetic material, and inductors mounted on printed circuit boards. Various configurations for the sensor core are contemplated by the present invention and include toroids which have air gaps in their bodies.

An integrator 23 integrates the di/dt signal from the sensor 18 to produce a signal representing the current (i) carried by the line conductor 10. The integrated di/dt signal (or i signal) is thereafter processed by a signal conditioner 24 and converted to a series of pulses by analog-to-digital (A/D) converter 26. The current pulses are then sampled at a plurality of points by sampler 28. The sampled current is then processed by CPU 30, which determines the number of certain arcing fault characteristics occurring within a predetermined time interval. If the number of arcing fault characteristics exceed a trip threshold level within the predetermined time interval, the CPU 30 produces a trip signal to trigger the line interrupter 22.

Figure 2:
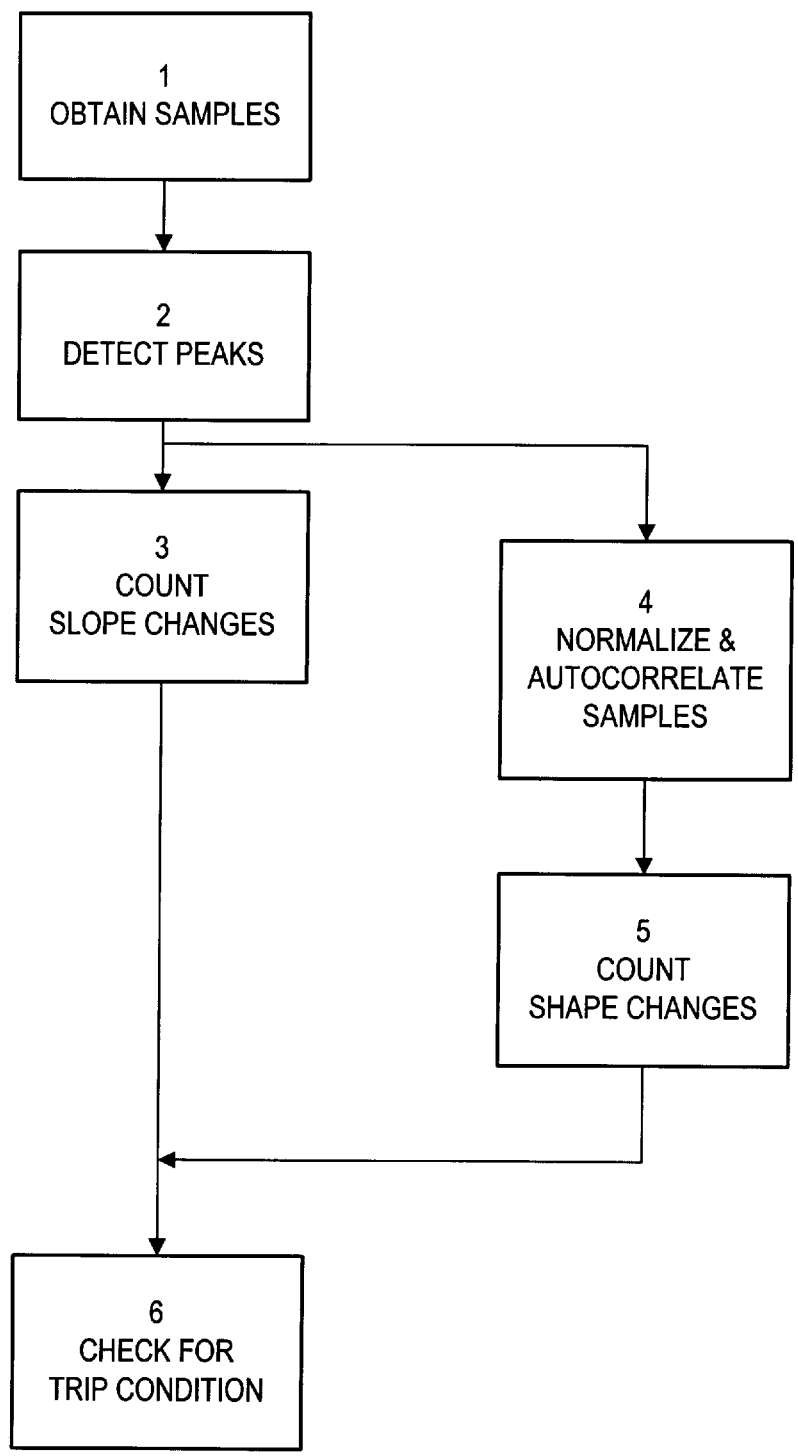
FIG. 2 is an overview flow chart of one manner of operating the arcing fault detection system of FIG. 1.

Turning now to FIG. 2, there is shown an overview flow chart of the steps accomplished by the arcing fault detection system according to one embodiment of the present invention. Each of these steps will be described in detail in relation to FIGS. 3a through 3e. Generally, however, step 1 represents the obtaining of current samples from the sampler 28. Preferably, samples will be taken from either two consecutive half-cycles (e.g. a positive half-cycle followed by a negative half-cycle, or vice versa), two consecutive positive half-cycles or two consecutive negative half cycles.

Moreover, it is preferred that samples are taken at 32 points per half cycle of current, but it will be appreciated that an alternate number of sampling points may be used. Next, as represented by step 2, the CPU determines the magnitude of the current peak in each selected half cycle. Next, as represented by step 3, the "slope", or ratio of current peaks from one half cycle to the next is assigned a polarity (e.g. "positive" or "negative"), and the number of reversals of polarity between adjacent slopes is counted.

Finally, in step 6, the number of reversals in polarity is compared to a trip threshold level. If the number of reversals in polarity exceed the trip threshold level, a trip signal is sent to the line interrupter 22 to disconnect the power source from the load. If the number of reversals in polarity do not exceed the trip threshold level and thereby do not represent an arcing fault, the above-described process repeats itself with newly obtained current samples until an arcing fault is detected. Preferably, the trip threshold level will be high enough so that reversals in polarity caused by known load transients do not trip the circuit breaker. In a preferred embodiment of the present invention, the trip threshold level is based on finding fifteen or more reversals in polarity per second.

In another embodiment of the present invention, the CPU 30 detects arcing faults by counting the number of significant waveform shape changes between half cycles in addition to counting the number of reversals in polarity. This is accomplished by performing step 3 heretofore described along with additional steps 4 and 5. In step 4, the CPU 30 normalizes and autocorrelates the current samples. Normalizing is accomplished by dividing each of the current samples by the peak current associated with the half cycle from which they were taken. Each of the current samples will thereby have a normalized magnitude less than or equal to 1. Autocorrelation is accomplished by comparing each one of the number of normalized current samples from one half cycle to the corresponding one of the number of normalized current samples in the next selected half cycle. As will be described in more detail hereinafter, the autocorrelation step is designed to obtain a measure of significant waveform shape changes between selected half cycles. In steps 5 and 6, the CPU counts the number of significant shape changes occurring within a predetermined time interval and sends a trip signal to the line interrupter 22 if the number of significant shape changes exceed a trip threshold level.

Similar to the trip threshold level associated with slope changes described above, the trip threshold level associated with shape changes will preferably be high enough so that significant shape changes caused by known load transients do not trip the circuit breaker. In a preferred embodiment of the present invention, the trip threshold level associated with shape changes is based on finding three significant shape changes per second. Thus, in a preferred embodiment of the present invention, the line interrupter may be triggered by fifteen or more reversals in polarity per second or three or more significant shape changes per second. It will be appreciated, however, that other trip thresholds and/or time intervals may be selected without departing from the scope of the present invention.

Figure 3A:
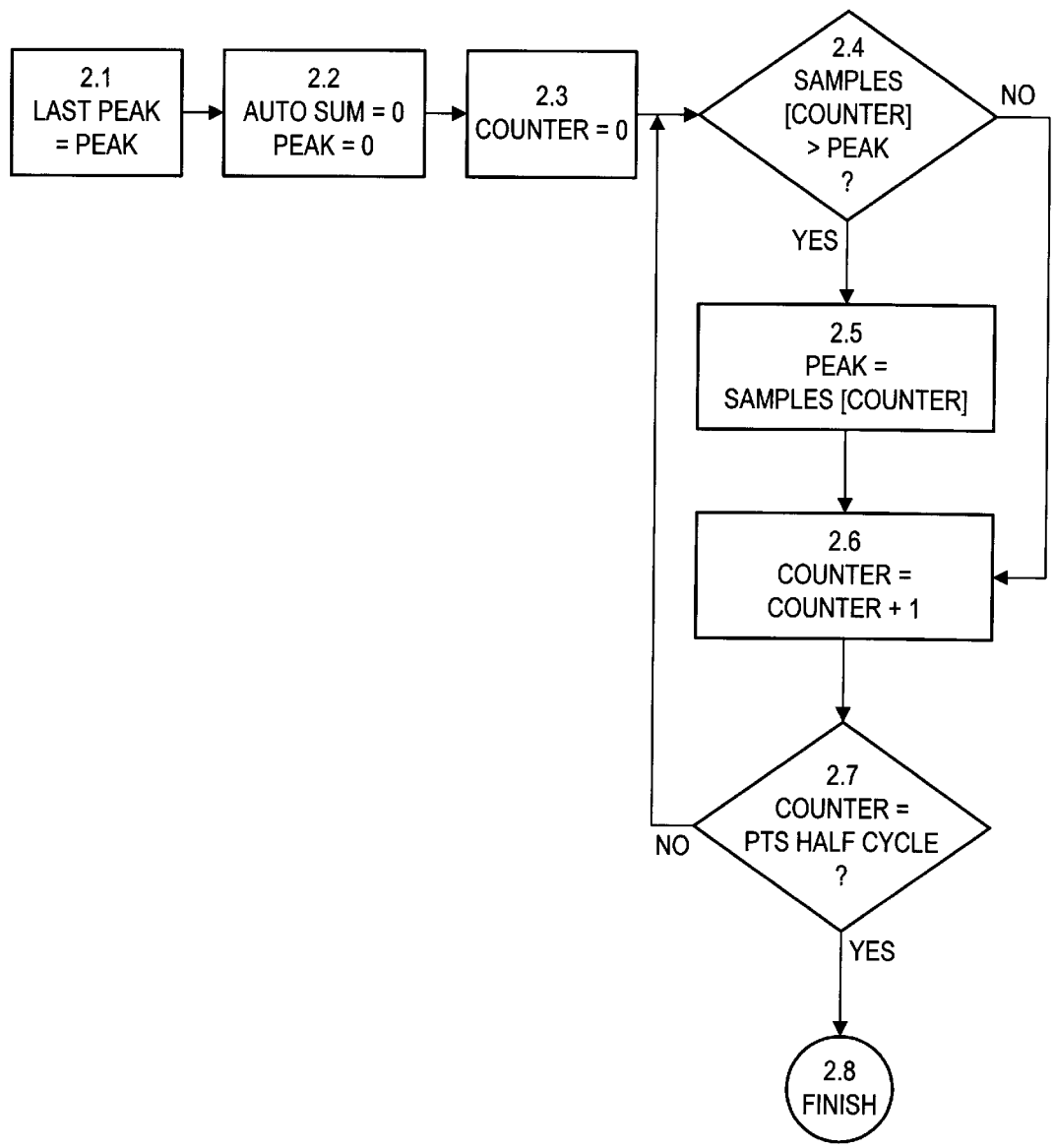
FIG. 3a is a flow chart illustrating the peak detection subroutine associated with step 2 in the flowchart of FIG. 2.

FIGS. 3a through 3e are flow charts representing the steps associated with the flowchart of FIG. 2 in greater detail. Referring initially to FIG. 3a, there is shown a flow chart illustrating the peak detection subroutine associated with step 2 of the flowchart of FIG. 2. In step 2.1, the peak current of the most recent half cycle is stored in memory as variable "last peak". In step 2.2, an "auto sum" and a "peak" variable associated with the present half cycle are initialized to zero. The "auto sum" variable will be described hereinafter in relation to FIGS. 3c through 3e. The "peak" variable represents the value of the current sample having the largest absolute magnitude in the present half cycle. An integer counter number is initialized to zero in step 2.3. In step 2.4, a current sample associated with the present counter number is compared to the value of the "peak" variable associated with the next most recent counter number in the present cycle. For example, in the 5th iteration of step 2.4, current sample 5 is compared to the "peak" variable obtained through current samples 1–4 of the present cycle. If the current sample associated with the counter number is greater than any of the previous current samples in the present cycle, the "peak" variable is reset to match the absolute magnitude of the current sample (step 2.5). The counter number is thereafter incremented by one (step 2.6) and, if the counter number is less than the number of points per half cycle (step 2.7), the process returns to step 2.4 with the next current sample. In step 2.4, if the current sample associated with the counter number is not greater than the previous "peak" variable, the process proceeds to step 2.6 and continues as heretofore described. In bypassing step 2.5, the "peak" variable is not reset but rather retains whatever value it had prior to the present current sample. Finally, in step 2.7, if the counter number equals the number of points in the half cycle, the process is complete. The value of the "peak" variable upon completion of the process thereby represents the absolute value of the peak current sample in its associated half cycle.

Figure 3B:
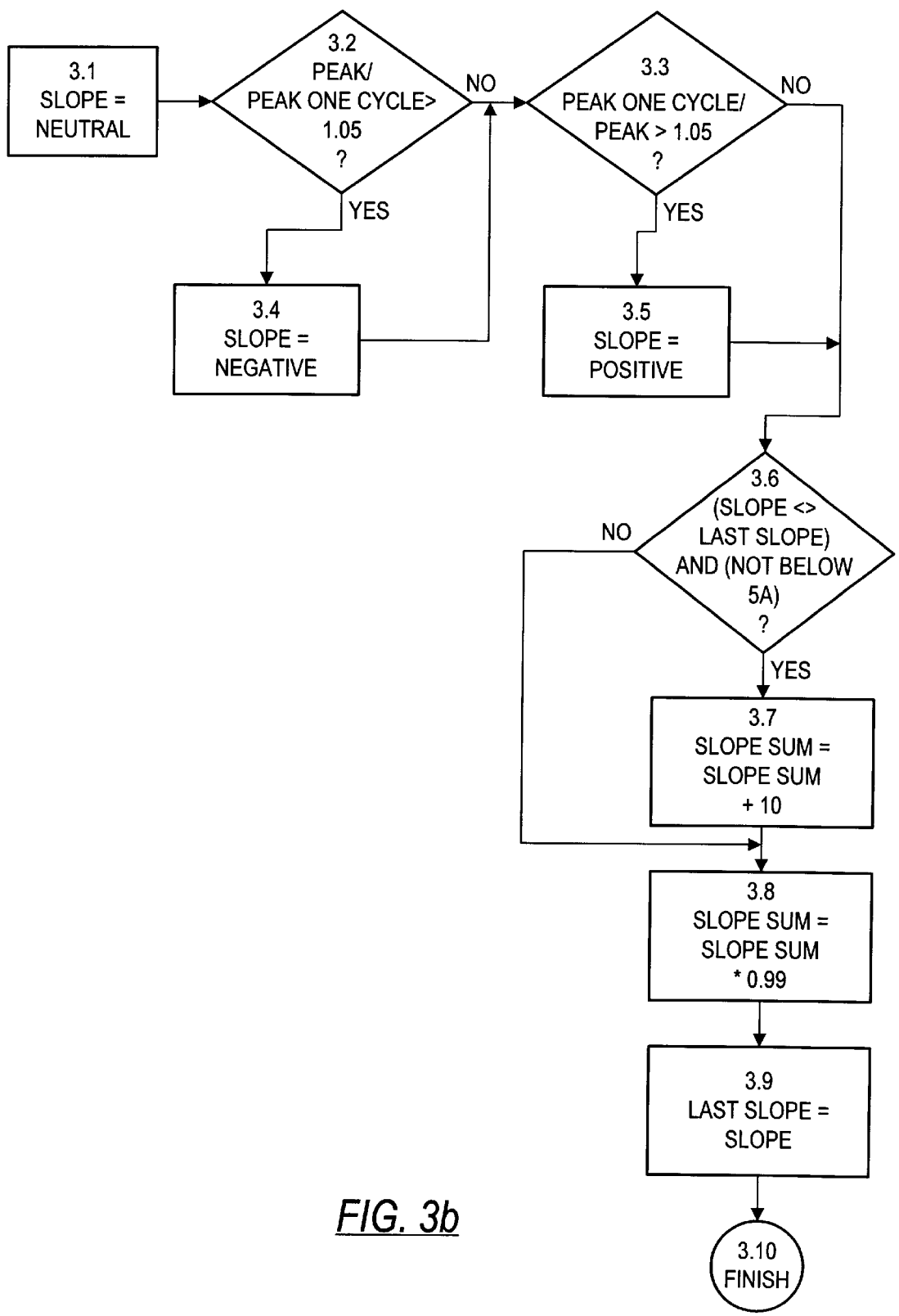
FIG. 3b is a flow chart illustrating the counting slope changes subroutine associated with step 3 in the flowchart of FIG. 2.

Turning now to FIG. 3b, there is shown a flow chart illustrating the count slope changes subroutine associated with step 3 of the flowchart of FIG. 2. In step 3.1, a "slope" variable is initialized to neutral. The "slope" variable represents the slope of a line drawn from the current peak in a first selected half cycle (designated as variable "peak") to the current peak in a second selected half cycle (designated as variable "peak one cycle"). Preferably, the "peak" and "peak one cycle" variables represent the current peaks of consecutive positive (or negative) half cycles.

In steps 3.2 and 3.3, the current peaks in the selected half cycles are compared to each other to determine if they represent a significant slope change, defined here as being greater than 5%. More specifically, the ratio of "peak" to "peak one cycle" is evaluated in step 3.2, and the ratio of "peak one cycle" to "peak" is evaluated in step 3.3. If the ratio derived in step 3.2 is greater than 1.05, the slope variable is designated as negative (step 3.4). If the ratio derived in step 3.3 is greater than 1.05, the slope variable is designated as positive (step 3.5). If neither ratio is greater than 1.05, the slope remains designated as neutral.

In step 3.6, the slope direction associated with the selected pair of half cycles is compared to the slope direction of the next most recent pair of half cycles. A change in slope occurs when the slope directions change in polarity (e.g. from "positive" to "negative", or vice versa) and neither of the peaks is less than five amps. Current peaks of less than five amps are ignored because they do not represent a significant electrical hazard. If it is determined in step 3.6 that a change in slope has occurred, the slope change is counted in step 3.7 by incrementing a "slope sum" variable by an arbitrary number, here 10. In step 3.8, the "slope sum" variable is multiplied by 0.99 to decay the cumulative value of the "slope sum" variable by one percent at each sampling point of the waveform.

Figure 3C:
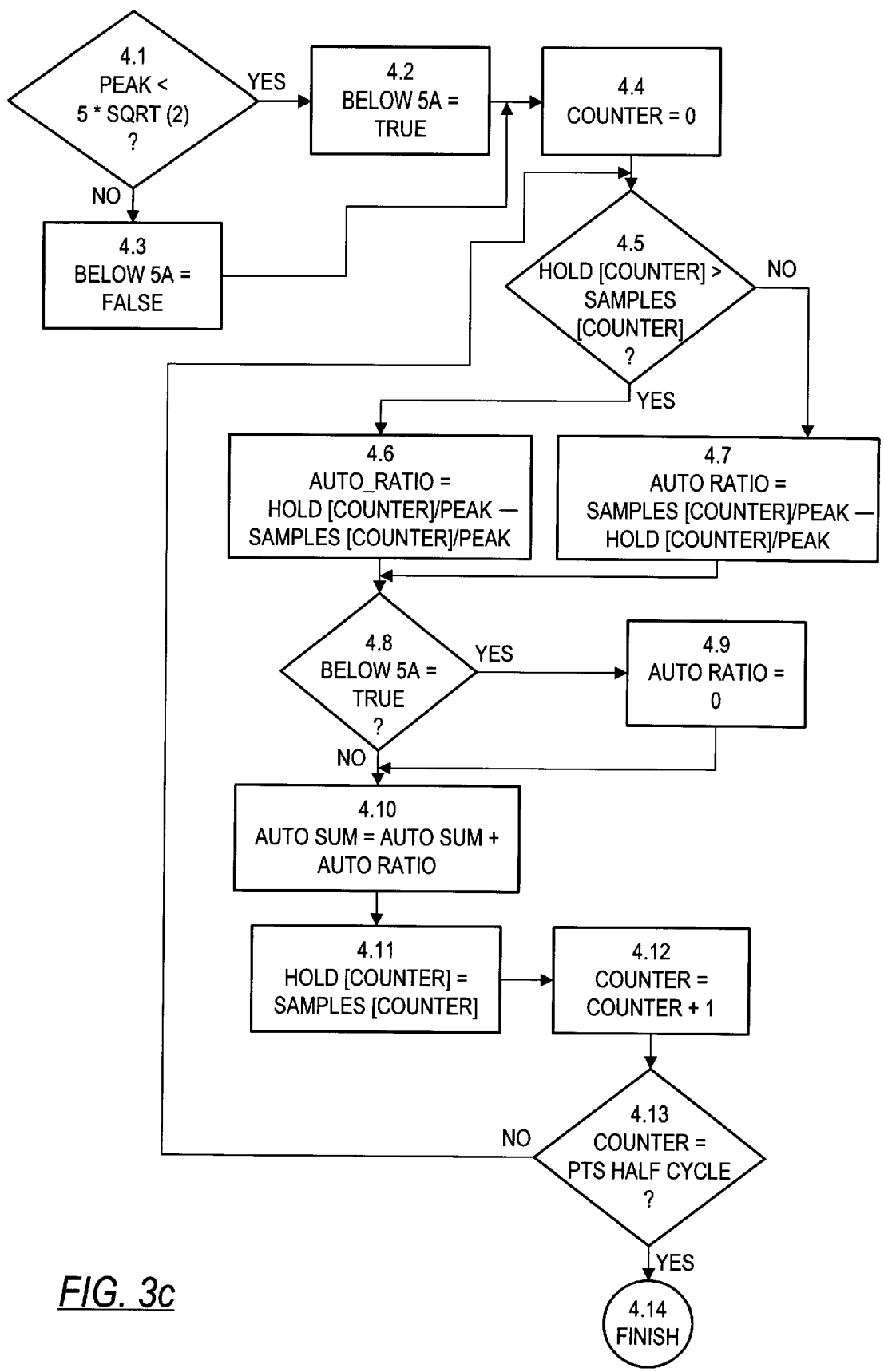
FIG. 3c is a flow chart illustrating the normalization and autocorrelation subroutines associated with step 4 in the flowchart of FIG. 2.

FIG. 3c is a flow chart illustrating the normalization and autocorrelation subroutines associated with step 4 in the flowchart of FIG. 2. Normalizing the current values before autocorrelating them enables the present invention to avoid a problem associated with the prior art, namely "false tripping" or erroneously indicating an arcing fault in response to load transients caused by, for example, the starting of an electrical motor. Because load transients cause changes in magnitude of the current between cycles, arc detection systems which indicate or at least conditionally indicate an arcing fault in responses to changes in magnitude in current are likely to false trip in response to the load transients. By normalizing the current values in every half cycle to a peak of "1", the arcing fault detection system according to the present invention is insensitive to increases in magnitude in current caused by load transients, and thereby is not likely to false trip in response to load transients.

In step 4.1, it is determined whether or not the "peak" variable has an rms value of less than 5 amps. If it is less than 5 amps, a boolean "Below 5A" variable is designated as True (step 4.2). If it is not less than 5 amps, the "Below 5A" variable is designated as False (step 4.3). An integer counter number is initialized to zero in step 4.4.

In step 4.5, the sampled current from a selected half cycle associated with the counter number (designated "samples[counter]") is compared to the sampled current from a previous half cycle associated with the same counter number (designated "hold[counter]"). For example, in the tenth iteration, sample "10" from the present half cycle is compared to the stored current sample "10" from the previous half cycle. Thereafter, in step 4.6 or 4.7, the current samples associated with the counter number in both the present cycle and previous cycle are normalized by dividing them by the peak current associated with the previous cycle, then subtracted from each other to obtain the difference between the normalized current from the present cycle to the previous half cycle. The smaller of the two normalized values is subtracted from the larger of the two normalized values so that the difference comprises a positive number representing the absolute value between the two normalized values. This result is designated by the variable "auto ratio".

In step 4.8, if the "Below 5A" variable is true, the "auto ratio" variable associated with the counter number is set to zero in step 4.9. In step 4.10, an "auto sum" variable, representing the cumulative sum of the ratios of corresponding current samples in selected half cycles, is incremented by the value of the "auto ratio" variable heretofore described.

The "hold[counter]" variable associated with the counter number is then reset to the value of the "samples[counter]" variable associated with the counter number (step 4.11), and the counter number is incremented by one (step 4.12). If the counter number is less than the number of points per half cycle (step 4.13), the process returns to step 4.5 with the next current sample. The process is complete when the counter number equals the number of points in the half cycle. The value of the "auto sum" variable upon completion of the process thereby represents a measure of shape changes between selected half cycles.

Figure 3D:
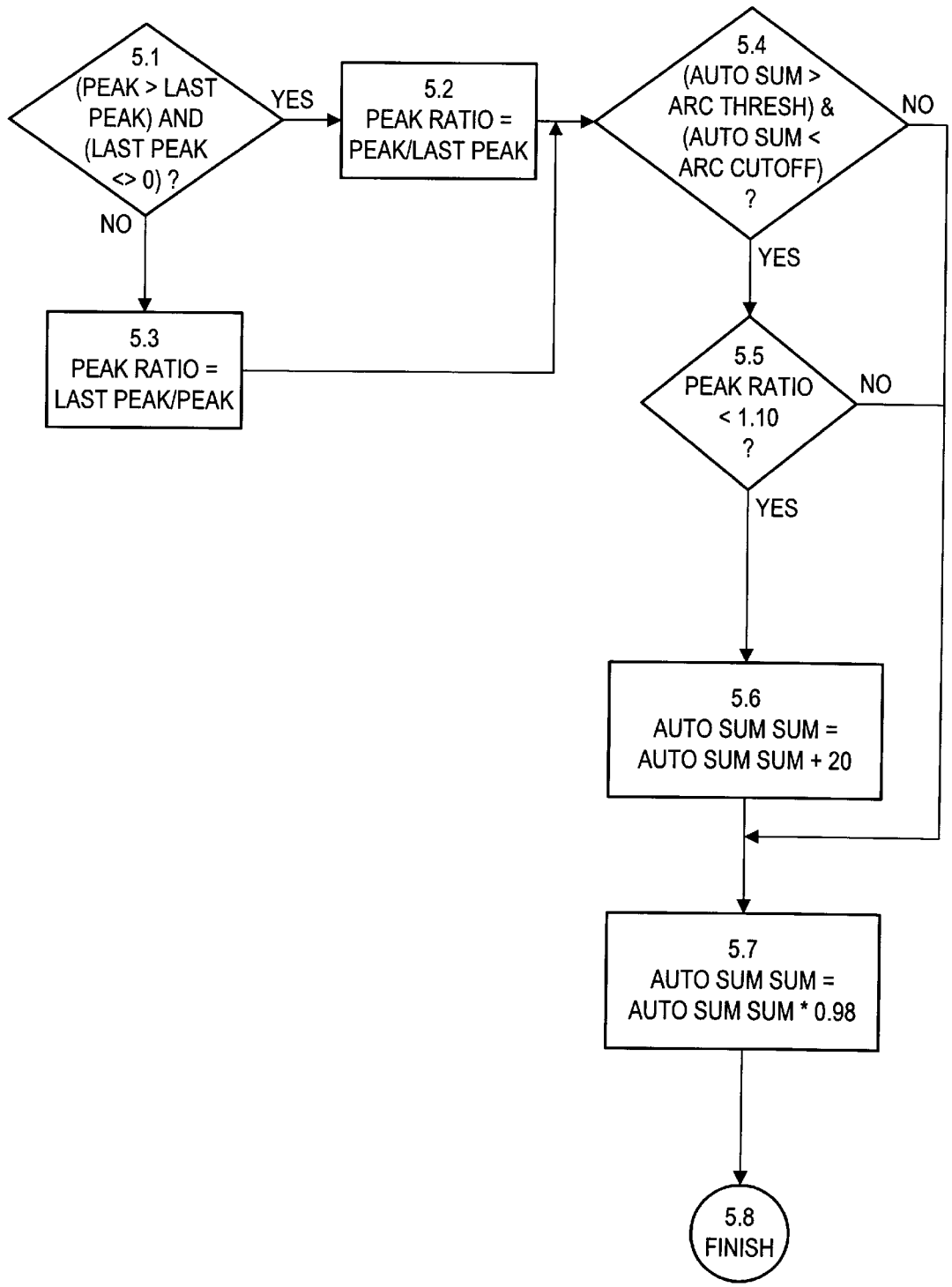
FIG. 3d is a flow chart illustrating the counting shape changes subroutine associated with step 5 in the flowchart of FIG. 2.

FIG. 3d is a flow chart illustrating the counting shape changes subroutine associated with step 5 in the flowchart of FIG. 2. In step 5.1, it is determined whether the "peak" variable is greater than the "last peak" variable and the "last peak" variable is not equal to zero. Thereafter, in step 5.2 or 5.3, the ratio of the present peak to the last peak (designated by variable "peak ratio") is computed. Next, in step 5.4, it is determined whether the "auto sum" variable described in relation to FIG. 3c is greater than an arc threshold value and less than an arc cutoff value. The arc threshold value, as previously described, is preferably based on detecting 16 significant waveform shape changes per second. The arc cutoff value is based on detecting an excessively large number of significant shape changes, which indicate load fluctuations rather than arcs. In step 5.5, it is determined whether the peak ratio is less than 1.10. If the answer in both steps 5.4 and 5.5 is determined to be yes, a significant shape change has occurred and an "auto sum sum" variable is incremented by an arbitrary number (here 20) in step 5.6. In step 5.7, the "auto sum sum" variable is multiplied by 0.98 to decay the cumulative value of the "auto sum sum" variable by two percent at each sampling point of the waveform.

Figure 3E:
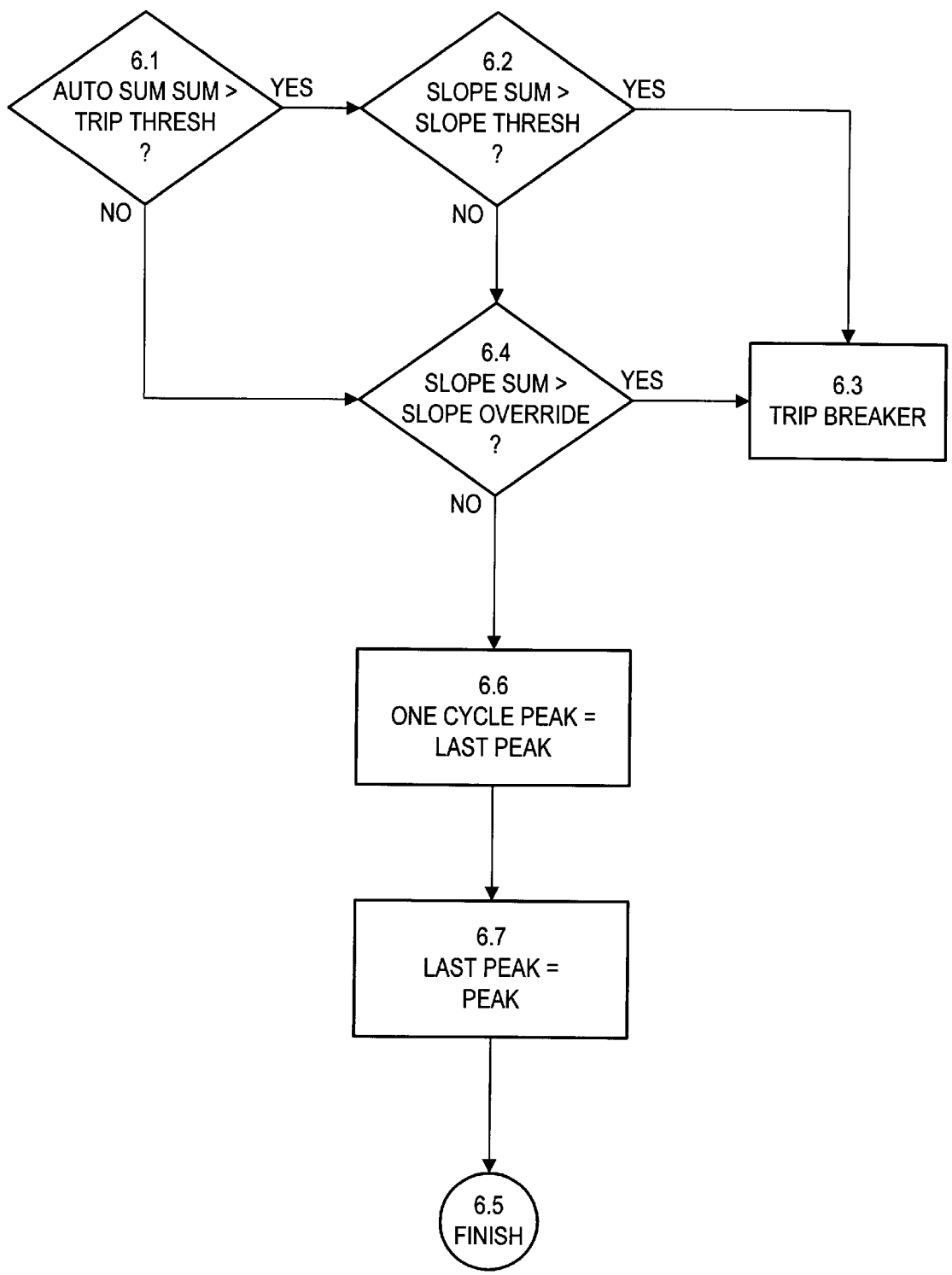
FIG. 3e is a flow chart illustrating the check for trip condition subroutine associated with step 6 in the flowchart of FIG. 2.

Now turning to FIG. 3e, there is shown a flow chart illustrating the check for trip condition subroutine associated with step 6 in the flowchart of FIG. 2. If the number of significant shape changes represented by the "auto sum sum" variable is greater than a trip threshold level (step 6.1) and the number of slope changes represented by the "slope sum" variable is greater than a slope threshold level (step 6.2), a trip signal is generated to trip the circuit breaker (step 6.3). The circuit breaker is also tripped if the slope sum sum is greater than a slope override level (step 6.4). If neither of the trip conditions occur, the peak current of the most recent half cycles are stored in memory in steps 6.6 and 6.7, and the entire process of detecting arcing faults continues with subsequent half cycles.

Figure 4A:
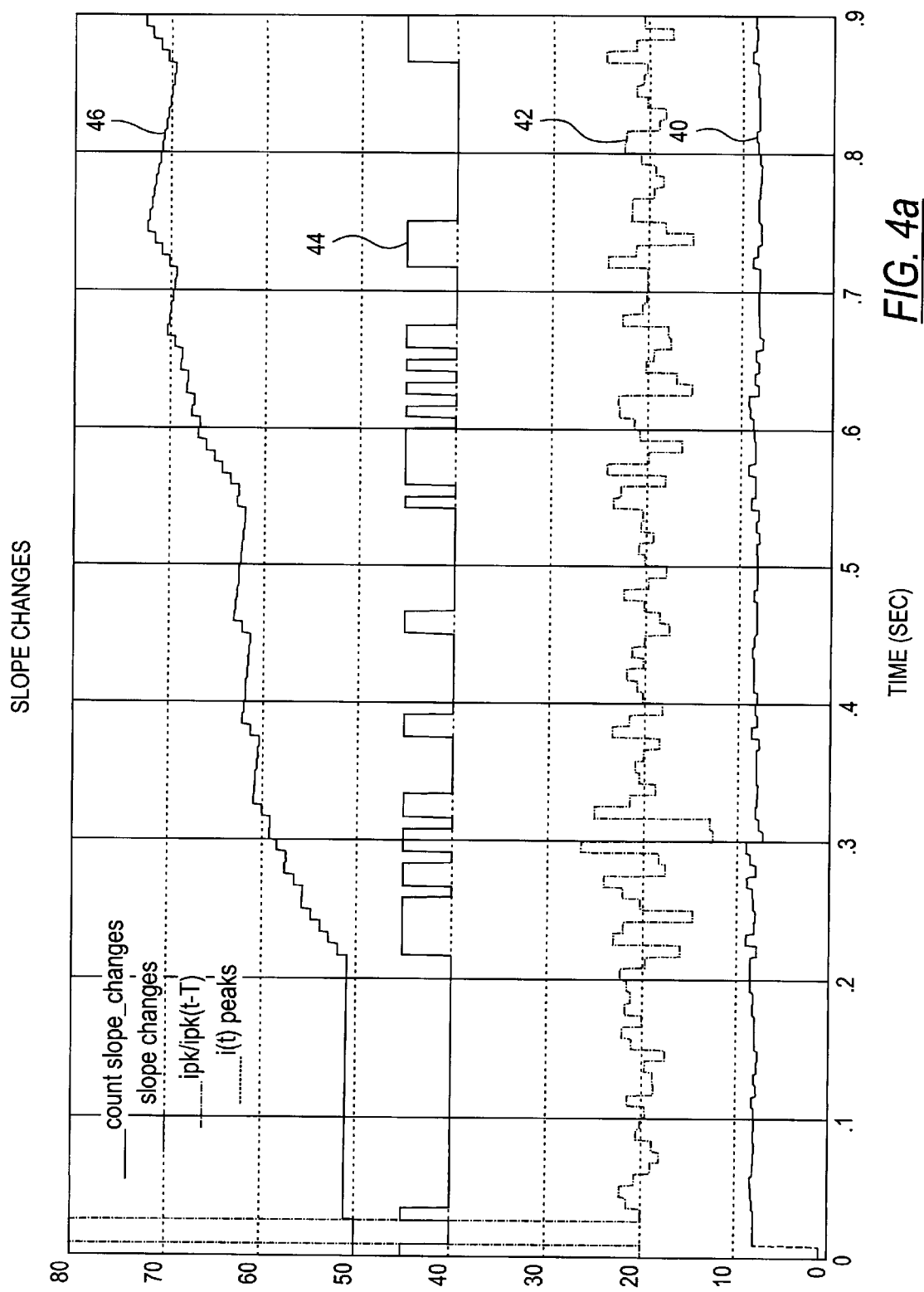
FIG. 4a depicts the waveforms associated with the detection of slope changes according to one aspect of the present invention.
Figure 4B:
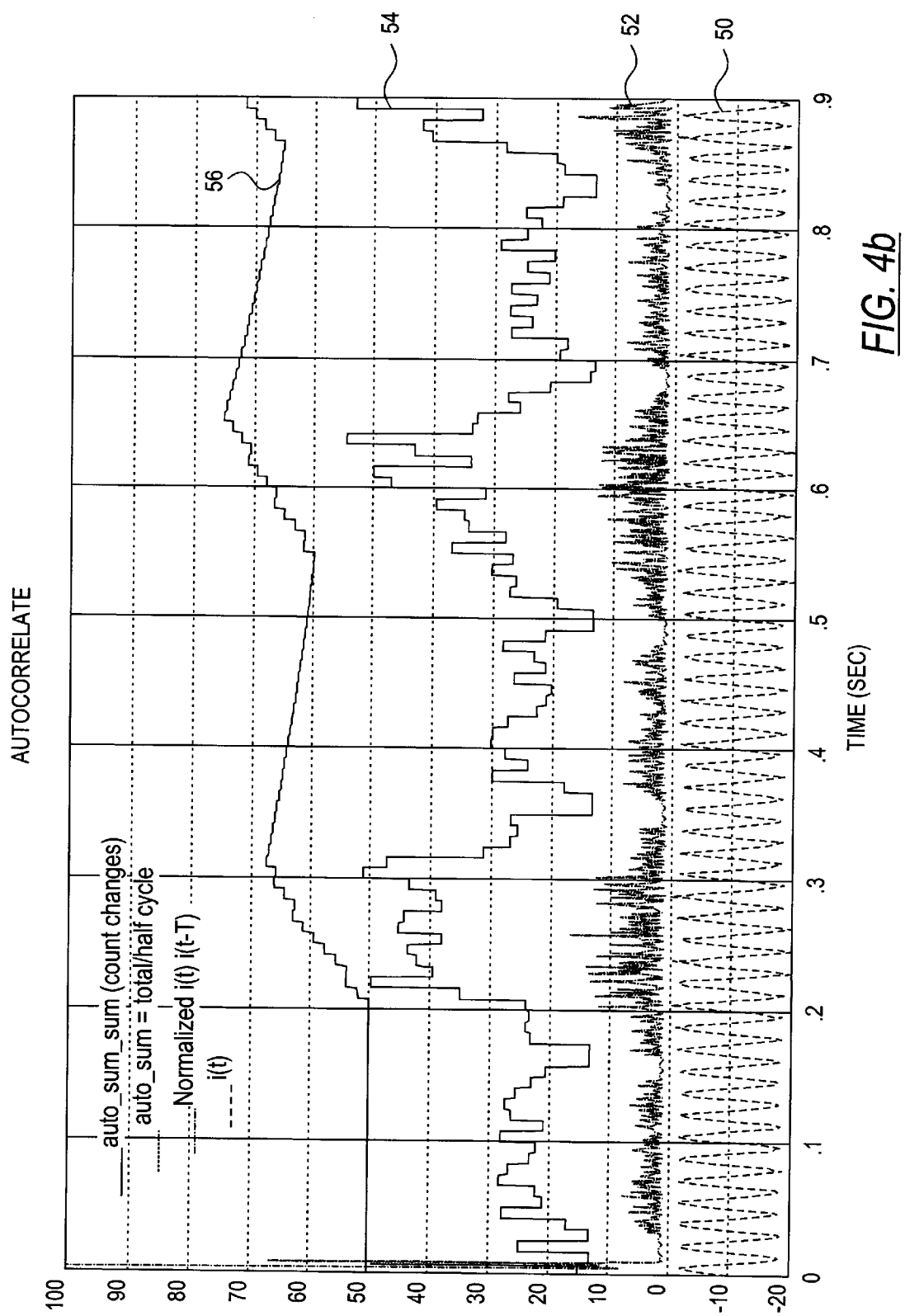
FIG. 4b depicts the waveforms associated with the detection of shape changes according to one aspect of the present invention.

The subroutines described in relation to FIG. 3a through FIG. 3e may perhaps best be understood by reference to the series of waveforms shown in FIG. 4a and 4b. FIG. 4a depicts the waveforms associated with the detection of slope changes and FIG. 4b depicts the waveforms associated with the detection of shape changes. Turning initially to FIG. 4a, waveform 40 represents the "peak" variable discussed in relation to FIG. 3a. The "peak" variable represents the value of the current sample having the largest absolute magnitude in its associated half cycle. Thus, waveform 40 is comprised of one discrete value per cycle, or 12 discrete values per every tenth of a second. As shown in FIG. 4a, the "peak" waveform 40 has a minimum value of zero amps (corresponding reference position "0" in FIG. 4a) and a maximum value of about ten amps (corresponding to reference position "10" in FIG. 4a).

Waveform 42 represents the slope of the current peaks from one half cycle to the previous half cycle. As heretofore defined, the slope is computed by taking the ratio of the current peak in one half cycle to the current peak of the previous half cycle. The ratios falling above the line represent "positive" slopes and the ratios falling below the line represent "negative" slopes. The waveform 42 is centered on zero percent (corresponding to reference position "20" in FIG. 4a) and fluctuates between a minimum value of about minus two percent (corresponding to reference position "10") and a maximum value of about plus two percent (corresponding to reference position "30").

Waveform 44 comprises a series of pulses indicating whether the slopes of waveform 42 have changed in polarity (e.g. from "positive" to "negative" or vice versa) from cycle to cycle. As described in relation to FIG. 3b, slope changes are indicated only if the peak currents between cycles differ by at least 5% and if the peak current is not less than 5 amps rms. As shown in FIG. 4a, the waveform 44 comprises a series of binary zeros (corresponding to reference position "40") indicating that a slope change has not occurred and binary "ones" (corresponding to reference position "45") indicating that a slope change has occurred.

Waveform 46 represents the "slope sum" variable described in relation to FIG. 3b, comprising a count of significant slope changes from cycle to cycle. As shown in FIG. 4a, the "slope sum" waveform 46 has a minimum value of zero (corresponding to reference position "50") and a maximum value of about thirty (corresponding to reference position "80"). A first trip criteria for the arcing fault detection system is triggered when the "slope sum" variable 46 equals or exceeds fifteen significant slope changes per second (corresponding to y-axis reference "65").

Now turning to FIG. 4b, waveform 50 represents the current i(t) on the line conductor, comprising an ac waveform at a frequency of 60 Hz throughout a time interval of 0.9 seconds. Each cycle has a period of ⅟₆₀th of a second, or 16.67 milliseconds. Accordingly, there are 6 full cycles (or 12 half cycles) every tenth of a second. The i(t) waveform is centered on zero amps (corresponding to y-axis reference "–10") and cycles between a minimum value of about minus 10 amps (corresponding to reference position "–20") and a maximum value of about plus 10 amps (corresponding to reference position Waveform 52 represents the value of the "auto ratio" variable discussed in relation to FIG. 3c. The "auto ratio" variable represents the differences between the normalized current from the sample position in one half cycle to that of the corresponding sample position in the previous half cycle, expressed as a percentage. The "auto ratio" waveform 52 thereby represents a plurality of individual "auto ratio" variables, 32 per half cycle, corresponding to the number of samples taken of the i(t) waveform 50. As shown in FIG. 4b, the "auto ratio" waveform 52 has a minimum value of zero percent (corresponding to reference position "0") and a maximum value of about twenty percent (corresponding to reference position "10").

Waveform 54 represents the "auto sum" variable discussed in relation to FIG. 3c. The "auto sum" variable is computed by summing the "auto ratio" waveform 52 in each half cycle. Thus, the "auto sum" waveform 54 provides a measure of the number of shape changes per half cycle, comprising one discrete value per half cycle, or 12 values for every tenth of a second. As shown in FIG. 4b, the "auto sum" waveform 54 has a minimum value of zero (corresponding to reference position "10") and a maximum value of about eight (corresponding to reference position "50").

Waveform 56 represents the "auto sum sum" variable discussed in relation to FIG. 3d. As discussed above, the magnitude of the "auto sum sum" variable is dependent on whether the "auto sum" waveform 54 is greater than an arc threshold value and less than an arc cutoff value, and whether the ratio of current peaks from cycle to cycle is less than 10%. If these conditions are satisfied, a significant shape change has occurred and the "auto sum sum" variable is incremented accordingly. As shown in FIG. 4b, the "auto sum sum" waveform 56 has a minimum value of zero (corresponding to reference position "50") and a maximum value of about twelve or thirteen (corresponding to reference position "75"). A second trip criteria for the arcing fault detection system is triggered when the "auto sum sum" variable 56 equals or exceeds three significant shape changes per second (corresponding to reference position "56").

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. A method of detecting arcing faults in a line conductor carrying an electrical current between a power source and a load, said electrical current defining an AC waveform comprising a series of alternating positive half cycles and negative half cycles, said method comprising the steps of:

(a) obtaining current samples in a series of half cycles of said waveform;

(b) determining a peak current within each of the series of half cycles;

(c) comparing the peak currents of a selected pair of said half cycles to determine a slope direction between said selected pair of half cycles;

(d) counting a number of reversals in polarity occurring in a selected time interval, said reversals in polarity occurring when the slope direction between said selected pair of half cycles differs from the slope direction of a next selected pair of half cycles;

(e) generating an arc indicative signal when the number of reversals in polarity occurring within said selected time interval equals or exceeds a predetermined threshold number.

2. The method of claim 1 wherein the selected pair of half cycles comprises two consecutive half cycles.

3. The method of claim 1 wherein the selected pair of half cycles comprises two consecutive negative half cycles.

4. The method of claim 1 wherein the selected pair of half cycles comprises two consecutive positive half cycles.

5. The method of claim 1 wherein step (d) comprises counting only the number of reversals in polarity in which the peak current of a second of said selected pair of half cycles is at least five amps.

6. The method of claim 1 wherein step (d) comprises counting only the number of reversals in polarity in which the peak currents of said selected pair of half cycles differ by at least five percent.

7. The method of claim 1 wherein the selected time interval is one second and the predetermined threshold number is fifteen.

8. A method of detecting arcing faults in a line conductor carrying an electrical current between a power source and a load, said electrical current defining an AC waveform comprising a series of alternating positive half cycles and negative half cycles, said method comprising the steps of:

(a) obtaining current samples in a series of half cycles of said waveform;

(b) determining a peak current within each of the series of half cycles;

(c) normalizing each of the current samples;

(d) comparing the peak currents of a selected pair of said half cycles to determine a slope direction between said selected pair of half cycles;

(e) autocorrelating the normalized current samples to obtain a measure of significant waveform shape changes between the selected half cycles;

(f) counting a number of reversals in polarity occurring within a selected time interval, said reversals in polarity occurring when the slope direction between said selected pair of half cycles differs from the slope direction of a next selected pair of half cycles;

(g) counting a number of significant waveform shape changes occurring within said selected time interval; and (h) generating an arc indicative signal when the number of reversals in polarity occurring within said selected time interval equals or exceeds a first predetermined threshold number and when the number of significant shape changes occurring within said selected time interval equals or exceeds a second predetermined threshold number.

9. The method of claim 8 wherein the selected pair of half cycles comprises two consecutive half cycles.

10. The method of claim 8 wherein the selected pair of half cycles comprises two consecutive negative half cycles.

11. The method of claim 8 wherein the selected pair of half cycles comprises two consecutive positive half cycles.

12. The method of claim 8 wherein step (e) comprises:

computing the differences between the normalized current samples of said selected pair of half cycles;

summing the absolute values of the differences between the normalized current samples of said selected pair of half cycles; and evaluating the summed absolute values in relation to a third predetermined threshold to determine whether the summed absolute values represent a significant waveform shape change between said selected pair of half cycles.

13. The method of claim 8 wherein the selected time interval is one second, the first predetermined threshold number is fifteen and the second predetermined threshold number is three.

14. The method of claim 8 wherein step (f) comprises counting only the number of reversals in polarity in which the peak current of a second of said selected pair of half cycles is at least five amps.

15. The method of claim 8 wherein step (f) comprises counting only the number of reversals in polarity in which the peak currents of said selected pair of half cycles differ by at least five percent.

16. An apparatus for detecting arcing faults in a line conductor carrying an electrical current between a power source and a load, said electrical current defining an AC waveform comprising a series of alternating positive half cycles and negative half cycles, said apparatus comprising:
   (a) a sampler for obtaining current samples in a series of half cycles of said waveform;
   (b) a peak detector for determining a peak current of each of the series of half cycles of said waveform;
   (c) means for comparing the peak currents of a selected pair of said half cycles to determine a slope direction between said selected pair of half cycles;
   (d) means for counting a number of reversals in polarity occurring within a selected time interval, said reversals in polarity occurring when the slope direction between said selected pair of half cycles differs from the slope direction of a next selected pair of half cycles; and
   (e) means for generating an arc indicative signal when the number of reversals in polarity occurring within said selected time interval equals or exceeds a predetermined threshold number.

17. The apparatus of claim 16 wherein the selected pair of half cycles comprises two consecutive half cycles.

18. The apparatus of claim 16 wherein the selected pair of half cycles comprises two consecutive negative half cycles.

19. The apparatus of claim 16 wherein the selected pair of half cycles comprises two consecutive positive half cycles.

20. The apparatus of claim 16 wherein the means for counting the number of reversals in polarity counts only the number of reversals in polarity in which the peak current of a second of said selected pair of half cycles is at least five amps.

21. The apparatus of claim 16 wherein the means for counting the number of reversals in polarity counts only the number of reversals in polarity in which the peak currents of said selected pair of half cycles differ by at least five percent.

22. The apparatus of claim 16 wherein the selected time interval is one second and the predetermined threshold number is fifteen.

23. An apparatus for detecting arcing faults in a line conductor carrying an electrical current between a power source and a load, said electrical current defining an AC waveform comprising a series of alternating positive half cycles and negative half cycles, said apparatus comprising:
   (a) a sampler for obtaining current samples in a series of half cycles of said waveform;
   (b) a peak detector for determining a peak current of each of the series of half cycles of said waveform;
   (c) means for comparing the peak currents of a selected pair of said half cycles to determine a slope direction between said selected pair of half cycles;
   (d) means for counting a number of reversals in polarity occurring within a selected time interval, said reversals in polarity occurring when the slope direction between said selected pair of half cycles differs from the slope direction of a next selected pair of half cycles; and
   (e) means for normalizing each of the current samples;
   (f) means for autocorrelating the normalized current samples to obtain a measure of significant waveform shape changes between the selected half cycles;
   (g) means for counting a number of significant waveform shape changes occurring within said selected time interval; and
   (h) means for generating an arc indicative signal when the number of reversals in polarity occurring within said selected time interval equals or exceeds a first predetermined threshold number and when the number of significant waveform shape changes occurring within said selected time interval equals or exceeds a second threshold number.

24. The apparatus of claim 23 wherein the selected pair of half cycles comprises two consecutive half cycles.

25. The apparatus of claim 23 wherein the selected pair of half cycles comprises two consecutive negative half cycles.

26. The apparatus of claim 23 wherein the selected pair of half cycles comprises two consecutive positive half cycles.

27. The apparatus of claim 23 wherein the means for counting the number of reversals in polarity counts only the number of reversals in polarity in which the peak current of a second of said pair of half cycles is at least five amps.

28. The apparatus of claim 23 wherein the means for counting the number of reversals in polarity counts only the number of reversals in polarity in which the peak currents of said selected pair of half cycles differ by at least five percent.

29. The apparatus of claim 23 wherein the selected time interval is one second, the first predetermined threshold number is fifteen and the second predetermined threshold number is three.

30. The apparatus of claim 23 wherein the means for autocorrelating the normalized current samples associated with the first and second half cycles comprises:
   means for computing the differences between the normalized current samples of said selected pair of half cycles;
   means for summing the absolute values of the differences between the normalized current samples of said selected pair of half cycles; and
   means for evaluating the summed absolute values in relation to a third predetermined threshold to determine whether the summed absolute values represent a significant waveform shape change between said selected pair of half cycles.

31. A method of detecting arcing faults in a line conductor carrying an electrical current between a power source and a load, said electrical current defining an AC waveform comprising a series of alternating positive half cycles and negative half cycles, said method comprising the steps of:
   obtaining current samples in a series of half cycles of said waveform;
   counting a number of significant slope changes in each of said half cycles; and
   generating an arc indicative signal when the number of significant slope changes within a selected time interval equals or exceeds a predetermined threshold number.

32. A method of detecting arcing faults in a line conductor carrying an electrical current between a power source and a load, said electrical current defining an AC waveform comprising a series of alternating positive half cycles and negative half cycles, said method comprising the steps of:

obtaining current samples in a series of half cycles of said waveform;

normalizing each of the current samples;

counting a number of significant slope changes in each of said half cycles;

counting a number of significant waveform shape changes in each of said half cycles; and generating an arc indicative signal when the number of significant slope changes occurring within a selected time interval equals or exceeds a first predetermined threshold number and when the number of significant shape changes occurring within said selected time interval equals or exceeds a second predetermined threshold number.

* * * * *